United States Patent

Tung

[11] Patent Number: 6,150,219
[45] Date of Patent: Nov. 21, 2000

[54] METHOD FOR FABRICATING A HIGH BIAS DEVICE

[75] Inventor: Ming-Tsung Tung, Hsinchu Hsien, Taiwan

[73] Assignee: United Microelectronics Corp., Hsinchu, Taiwan

[21] Appl. No.: 09/197,335

[22] Filed: Nov. 19, 1998

[51] Int. Cl.[7] ................................................. H01L 21/336
[52] U.S. Cl. ......................... 438/270; 438/271; 438/272; 438/430
[58] Field of Search ................................... 438/270, 271, 438/272, 430, 435

[56] References Cited

U.S. PATENT DOCUMENTS 5,891,770  4/1999  Lee ........................................... 438/270

*Primary Examiner*—Charles Bowers
*Assistant Examiner*—Yennhu B. Huynh
*Attorney, Agent, or Firm*—Thomas, Kayden, Horstemeyer & Risley

[57] ABSTRACT

A method for fabricating a high-bias semiconductor device contains several steps. A first-type semiconductor substrate is provided. A well doped with a second-type dopant is formed. Two episodes of ion implantation are performed to form two drift regions. The lower drift region has lighter dopant density but a greater thickness than the upper drift region. An annealing process is performed on the drift regions. A first pad oxide layer is formed over the drift regions. A first silicon nitride layer is formed over the first pad oxide layer. A trench is formed in the well. The first silicon nitride layer and the first pad oxide layer are removed. A second pad oxide layer is formed over the substrate including the trench bottom surface. A second silicon nitride layer is formed over the substrate on the second pad oxide layer other than the sidewall surface of the trench. A field oxide layer is vertically formed on each sidewall of the trench. The second silicon nitride layer is removed. A gate oxide layer is formed over the substrate including the trench bottom surface but excluding the surface of the field oxide layer. A trench gate filling the trench is formed by depositing polysilicon into the trench. A source region is on one side and a drain region is on the other side.

17 Claims, 5 Drawing Sheets

METHOD FOR FABRICATING A HIGH BIAS DEVICE

BACKGROUND OF THE INVENTION

1. Field of the Invention

This invention relates to a structure and fabrication method of a semiconductor device, and more particularly to a structure and fabrication method of a semiconductor device with high bias.

2. Description of Related Art

As the dimension of semiconductor devices is reduced, channel length of transistors is accordingly reduced as well. This makes operation speed faster but the resulting excessively short channel length causes some problems. The induced problems, or phenomena, are called a short channel effect. For example, when a constant bias is applied on the transistor, an electric field (E-field) is obtained on the channel by a formula of "E-field=bias/channel-length". If the channel length is shorter the E-field becomes stronger, and then electrons within the channel gain more energy because electrons are more strongly accelerated by the stronger E-field. As the E-field exceeds a critical quantity, an electrical breakdown then occurs on the transistor. In another case, if the channel length keeps constant but the bias increases, the E-field also increases so that electrical breakdown occurs.

However, it is quite common for current electronic products, such as a digital versatile disk (DVD) or a liquid crystal display (LCD), to be driven by high bias. A circuit device for driving the DVD and the LCD needs a high bias tolerance of about 12–30 volts. In general, a high-bias semiconductor device mainly utilizes an isolating layer and drift region under the isolating layer to increase the distance between an interchangeable source/drain and a gate. So, the high-bias semiconductor device can normally work with a high-bias power source.

FIGS. 1A–1D are cross-sectional views schematically illustrating a fabrication low for a conventional, high-bias semiconductor device. In FIG. 1A, a semiconductor substrate doped with a first type of dopant is provided (not shown). Then, a well 10 doped with a second type of dopant is formed on the substrate. If the first type of dopant is an N-type then the second type of dopant is a P-type, and if the first type of dopant is a P-type then the second type of dopant is an N-type. The P-type dopant is, for example, boron or gallium, and the N-type dopant is, for example, arsenic or phosphorus. Next, a thermal process is performed on the well 10 to form a pad oxide layer 20 over the well 10. A low chemical vapor deposition (LPCVD) process is performed to form a silicon nitride layer 30 over the pad oxide layer 20.

In FIG. 1A and FIG. 1B, a portion of the silicon nitride layer 30 is removed by photolithography and etching to expose the pad oxide layer 20. The silicon nitride layer 30 becomes a silicon nitride layer 50, on which a photoresist layer 40 remains. An ion implantation is performed to implant the exposed region of the pad oxide layer 20. A drift region 60 then is formed. The drift region 60 includes, for example, the first type of dopant, gallium.

Next, in FIG. 1C, the photoresist layer 40 is removed. A wet oxidation process is performed by using the silicon nitride layer 50 as a mask to form a field oxide layer 70 above the drift region 60. A bird's beak structure, or an acute structure, occurs on each end of the silicon nitride layer 50. The bird's beak structure is due to a high temperature from the wet oxidation process. The high-temperature environment drives the implanted ions inside the drift region 60 into the well 10 and forms the field oxide layer 70 above the drift region 60, where the field oxide layer 70 is not masked by the silicon nitride layer 50. The field oxide layer 70 pushes each end of the silicon nitride layer 50 to form the bird's beak structure.

In FIG. 1C and FIG. 1D, a wet etching process is performed to remove the silicon nitride layer 50 and the pad oxide layer 20 shown in FIG. 1B so that the well 10 is exposed. Then, a dry oxidation process is performed to form a gate oxide layer 80 over the well 10 and the field oxide layer 70. A gate layer 90 including, for example, polysilicon is formed over the gate oxide layer 80 by, for example, deposition. A portion of the gate oxide layer 80 and the gate layer 90 is removed by photolithography and etching, in which a region of the field oxide layer 70 and the well 10 is exposed. Then an ion implantation process with a high density but low energy condition is performed to implant the first-type dopant into the well 10 on the exposed region. The drift region 60, after implantation, becomes a drift region 100 below the exposed region, which is to serve as an interchangeable source/drain region.

The drift region 100 shown in FIG. 1D is a conventional drift region structure, which transversely increases the distance between the interchangeable source/drain region 100 and the gate layer 90 to prevent electrical breakdown. However this conventional method to solve the problem of electrical breakdown must increase device dimension. Furthermore, this method needs a few different dopant densities in the drift region 100 to increase the breakdown threshold voltage, and needs to employ a few photo-masks for forming this conventional drift region structure.

SUMMARY OF THE INVENTION

It is therefore an objective of the present invention to provide a high-bias semiconductor device, using a trench gate structure to form several drift regions distributed vertically. The lower drift region has a lighter dopant density and a greater thickness. This structure reduces the device dimension in the horizontal direction. Moreover, the present invention also includes a field oxide layer on each sidewall of the trench gate to reduce the effect of the high bias on the device. The breakdown threshold voltage is increased.

It is an another objective of the present invention to provide a fabrication method of a high-bias semiconductor device, using multi-implantation to form several drift regions with different dopant density and thickness. Therefore, the breakdown threshold voltage is increased.

In accordance with the foregoing and other objectives of the present invention, a method for fabricating a high-bias semiconductor device includes several steps. A first step is to provide a semiconductor substrate doped with a first-type dopant. Next step is forming a well doped with a second-type dopant. A few, such as two, episodes of ion implantation are performed to implant the first-type dopant into the well with different dopant density and different ion energy so that two drift regions are formed. The lower drift region has lighter dopant density but a greater thickness than the upper drift region. Next, an annealing process is performed on the drift regions. During the annealing process, a first oxide layer is formed on the substrate as well. The first oxide layer is removed, and then a first pad oxide layer is formed over the drift regions. A first silicon nitride layer is formed over the first pad oxide layer. A portion of the silicon nitride layer, the first pad oxide layer, and the drift regions is removed by photolithography and anisotropic etching to form a trench on the well. The first silicon nitride layer and the first pad oxide layer are removed. Next, a second pad oxide layer is formed over the substrate including the trench bottom surface. A second silicon nitride layer is formed over the substrate on the second pad oxide layer other than the sidewall surface of the trench. A field oxide layer is vertically formed on each sidewall of the trench. The second silicon nitride layer is removed. A gate oxide layer is formed by a dry oxidation process over the substrate including the trench bottom surface but excluding the surface of the field oxide layer. A trench gate filling the trench is formed by depositing polysilicon into the trench, in which an etching process or a chemical mechanical polishing process is performed to remove polysilicon outside the trench. Then, a step of performing photolithography and ion implantation, using the trench gate and the field oxide layer as a mask, is performed to implant the first-type dopant on each side of the upper drift region. A source region is on one side and a drain region is on the other side. Then annealing process is performed on the source region and the drain region.

The gate oxide layer preferably has a thickness of about 500–1000 Å, the field oxide layer preferably has a thickness of about 4000–12000 Å, and the dopant density of the source/drain regions is preferably about $10^{15}$ ions/cm$^2$.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

FIGS. 2A–2G are cross-sectional views schematically illustrating a fabrication flow of a high-bias semiconductor device, according to a preferred embodiment of the invention.

Figure 1A:
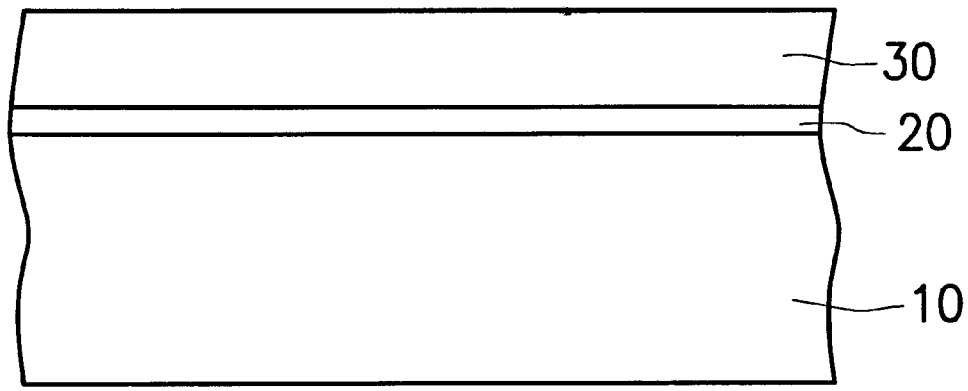
FIGS. 1A–1D are cross-sectional views schematically illustrating a fabrication flow of a conventional high-bias semiconductor device.
Figure 1B:
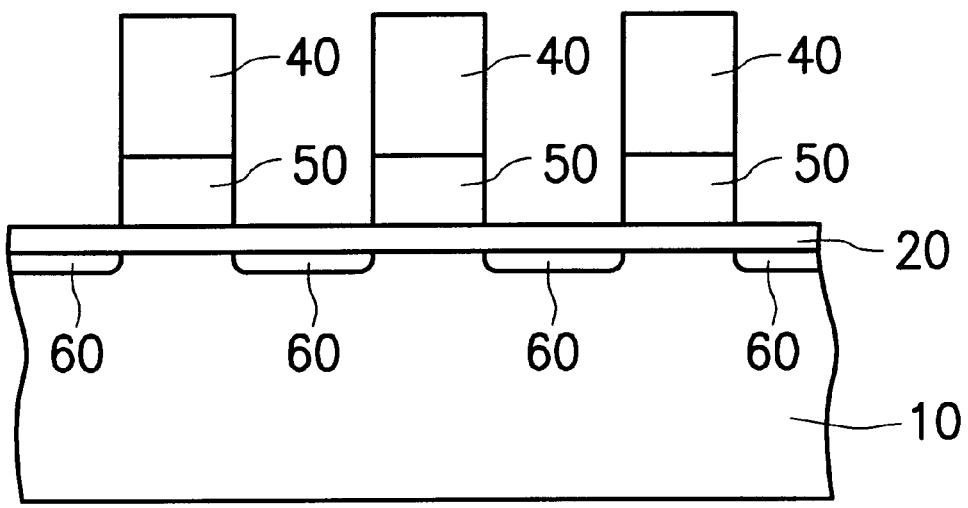
Figure 1C:
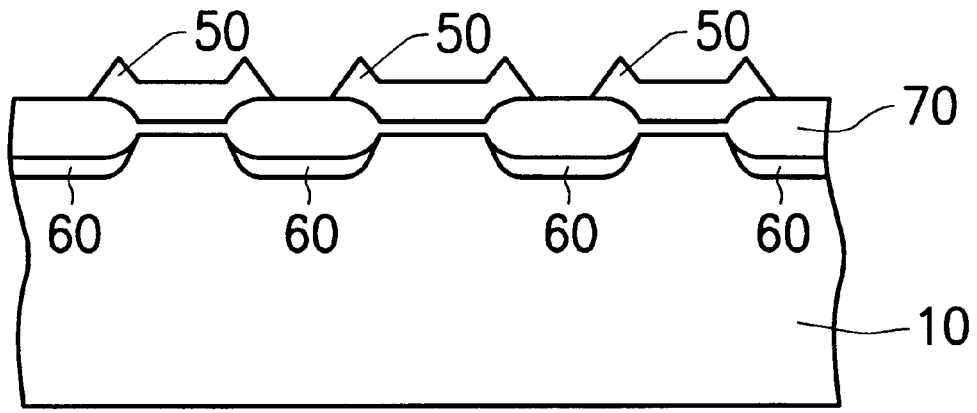
Figure 1D:
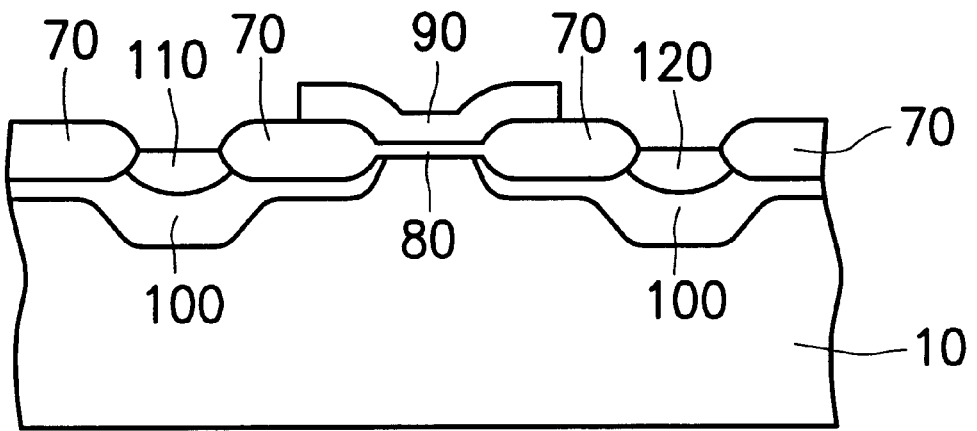
Figure 2A:
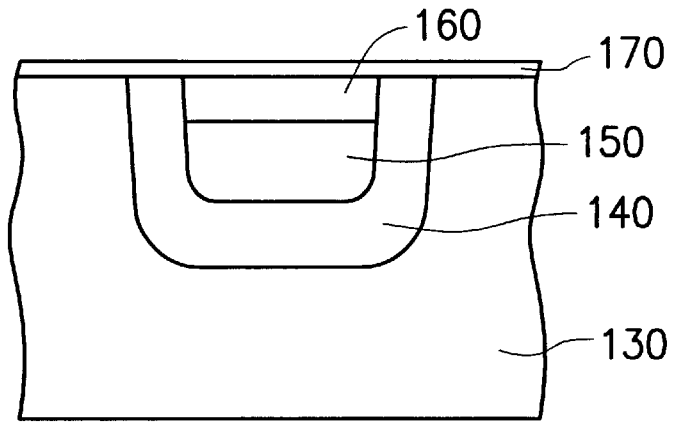
FIGS. 2A–2G are cross-sectional views schematically illustrating a fabrication flow of a high-bias semiconductor device, according to a preferred embodiment of the invention.

In FIG. 2A, a semiconductor substrate 130 doped with a first-type dopant is provided. A well 140 is formed in the substrate 130 by photolithography and ion implantation. The well 140 is implanted with a second-type dopant. If the first-type dopant is an N-type dopant then the second-type dopant is a P-type dopant, and if the first-type dopant is a P-type dopant then the second-type dopant is an N-type dopant. The N type dopant includes, for example, gallium or phosphorus. The P type dopant includes, for example, boron or arsenic. Next, a photolithography process and a few, such as two, episodes of ion implantation are performed to form several drift regions, such as two drift region layers 150, 160 inside the well 140. The lower drift region layer 150 is implanted by the first-type dopant with lighter density but greater thickness and higher ion energy than the upper drift region layer 160. The higher ion energy has a stronger penetration to deepen the lower drift region layer 150. Next, an annealing process is performed on the drift region layers 150, 160. During the annealing process, the surface of the substrate 130 is oxidized to form an oxide layer 170. Here, there are two drift region layers 150, 160 shown in the preferred embodiment. In general, the drift region structure includes several layers when it satisfies a condition that the lower layer has the lighter dopant density and the greater thickness. The increase of the breakdown threshold voltage and reduction of leakage current are one characteristic of the invention.

Figure 2B:
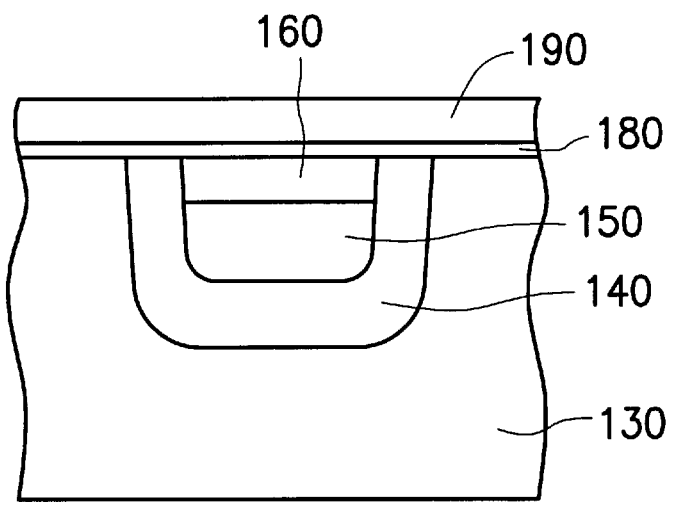

In FIG. 2B, a wet etching is performed to remove the oxide layer 170. Then, a thermal oxidation process is performed to form a pad oxide layer 180 over the substrate 130. Then, a silicon nitride layer 190 is formed over the substrate 130 by, for example, LPCVD.

Figure 2C:
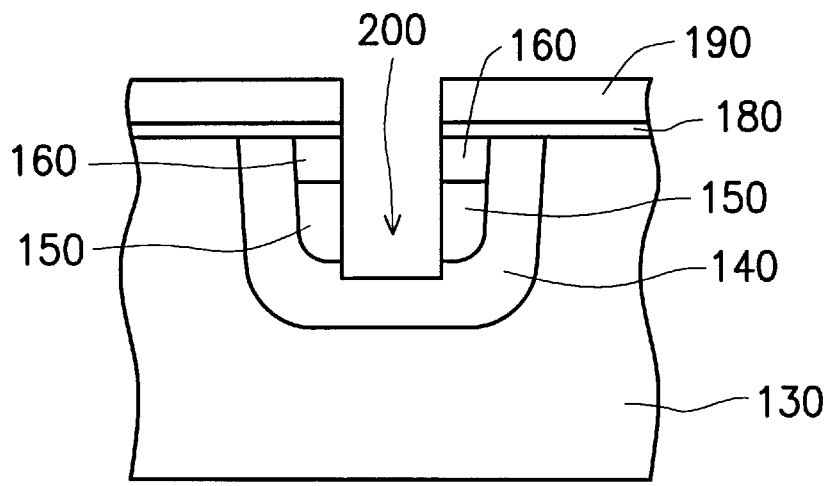
Figure 2D:
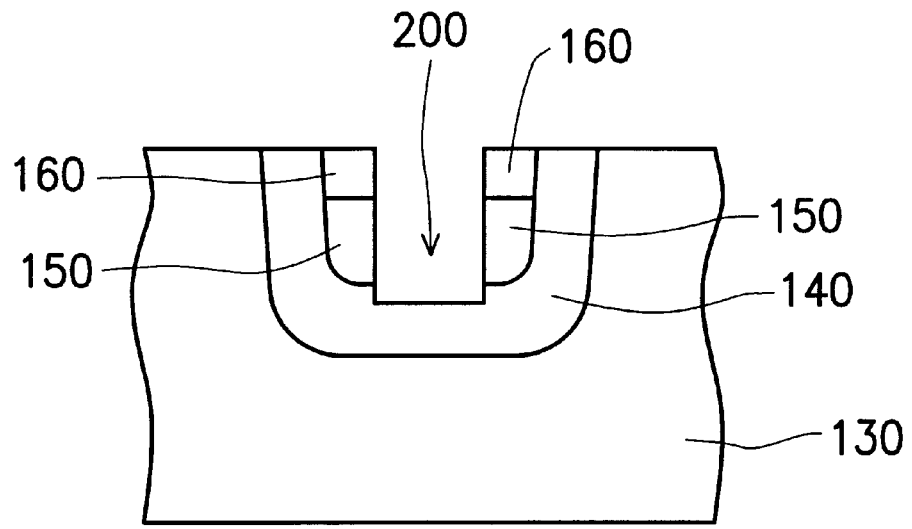

In FIG. 2C, a trench 200 is formed by patterning the silicon nitride layer 190, the pad oxide layer 180, and the drift region layers 150, 160. The patterning includes a photolithography process and an etching process such as a reactive ion etching (RIE) process. The trench 200 exposes the well 140. In FIG. 2D, a wet etching process is performed to remove the silicon nitride layer 190 and the pad oxide layer 180. The steps of forming and removing the pad oxide layer 180 and the silicon nitride layer 190 described above may be skipped.

Figure 2E:
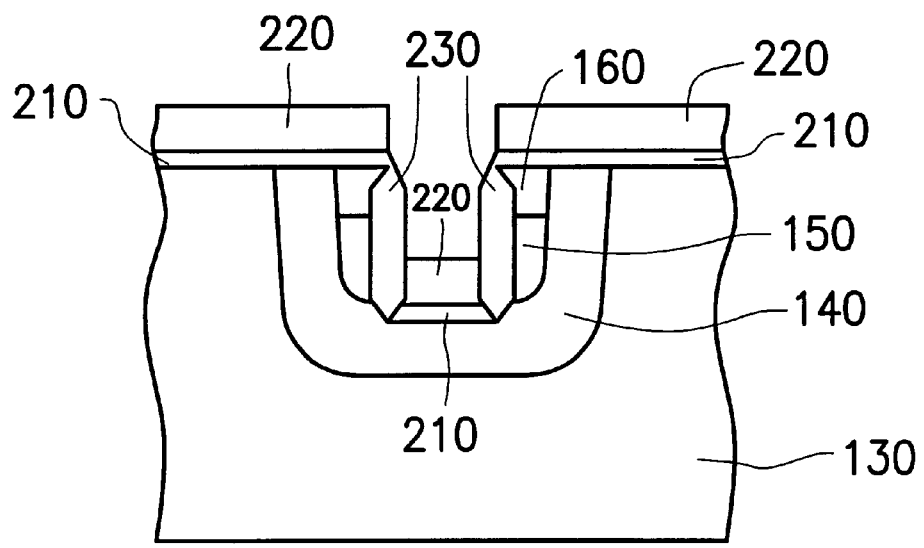

In FIG. 2E, a pad oxide layer 210 is formed over the substrate 130 including the bottom surface of the trench 200, and then a silicon nitride layer 220 is formed over the pad oxide layer 210 but not over each side wall of the trench 200. A vertical field oxide layer 230 is formed on each side wall of the trench 200 by wet oxidation. The field oxide layer 230 preferably has a thickness of about 4000–12000 Å.

Figure 2F:
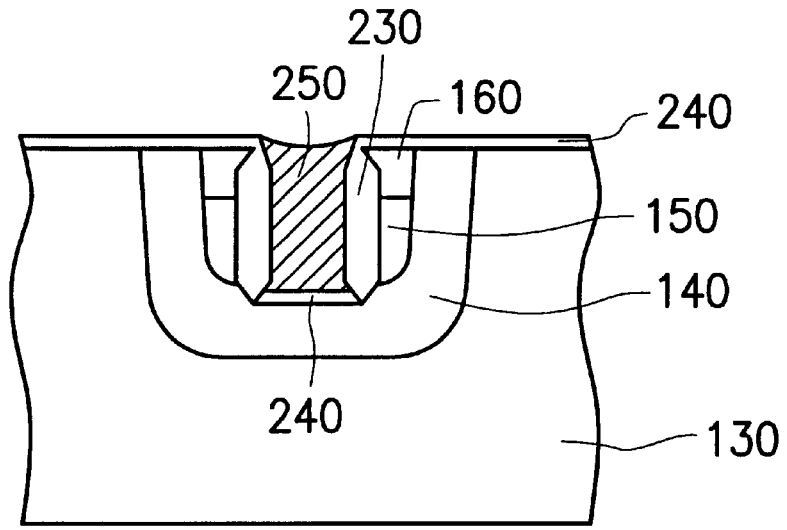

In FIG. 2F, the silicon nitride 220 and the pad oxide layer 210 are sequentially removed by, for example, wet etching. Then, a dry oxidation is performed to form a gate oxide layer 240 over the substrate 130, other than the field oxide layer 230 in the trench 200. The thickness of the gate oxide layer 240 is preferably about 500–1000 Å. Then, the trench 200 is filled by polysilicon to form a trench gate 250, in which a chemical mechanical polishing (CMP) or an etching back process is performed to remove undesired polysilicon outside the trench 200. The CMP uses the gate oxide layer as a polishing stop. The etching back process uses the gate oxide layer as the etching stop. The effective reduction of device horizontal dimension and reduction by the field oxide layer 230 of the effect of the high bias on the trench gate 250 are one characteristic of the invention.

Figure 2G:
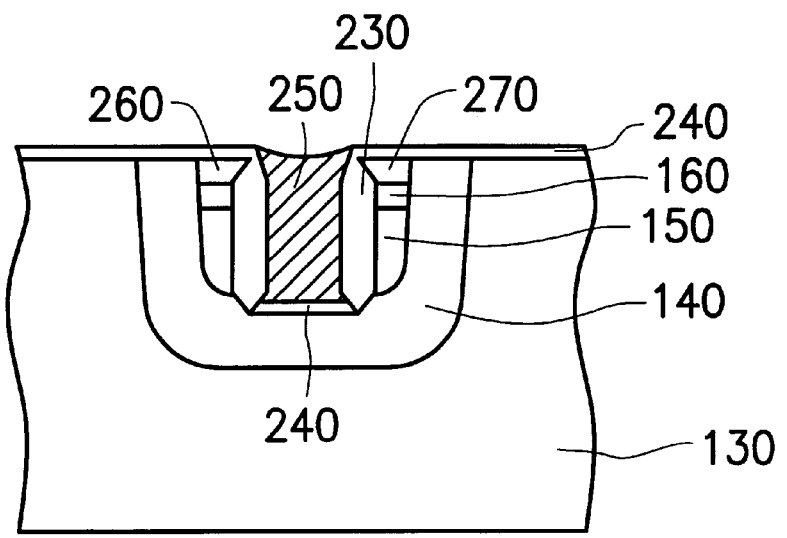

In FIG. 2G, a photolithography and an ion implantation, using the field oxide layer 230 and the trench gate 250 as a mask, are performed to partially implant the first-type dopant into a top portion of each side of the drift region layer 160. One side serves as a source region 260, and the other side serves as a drain region 270. The dopant density is preferably about $10^{15}$ ions/cm$^2$. Then an annealing process is performed on the source region 260 and the drain region 270. The high-bias semiconductor device of the invention is formed.

The high-bias semiconductor device of the invention is characterized as follows:

1. Several drift region layers, such as two drift region layers 150, 160 as shown in FIG. 2A, are included in the invention to increase the breakdown threshold voltage of the device. The drift region layers have vertically stacked drift region layers and a lower drift region layer with a lighter dopant density and a greater thickness.

2. A trench gate structure 250 with the vertical drift region layers 150, 160 effectively reduces the device horizontal dimension. The field oxide layer 230 also reduces the effect of the high bias on the trench gate 250.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a high-bias semiconductor device, the method comprising:

providing a semiconductor substrate doped with a first-type dopant, wherein a well doped with a second-type dopant is formed on the substrate, wherein if the first-type dopant is an N-type dopant then the second-type dopant is a P-type dopant, and if the first-type dopant is a P-type dopant then the second-type dopant is an N-type dopant;

performing at least two ion implantation processes with the first-type dopant and a different dopant energy to respectively form at least two drift region layers, wherein the at least two drift region layers follow a condition that a lower drift region layer has a lighter dopant density and a greater thickness;

forming a first pad oxide layer over the drift region layers;

forming a first silicon nitride layer on the first pad oxide layer;

forming a trench, which goes through the silicon nitride layer, the first pad oxide layer, and the drift region layers to expose the well;

removing the first pad oxide layer and the first silicon nitride layer;

forming a second pad oxide layer over the substrate;

forming a second silicon nitride layer over the substrate other than each sidewall of the trench;

forming a field oxide layer on each sidewall of the trench;

removing the second silicon nitride layer and the second pad oxide layer;

forming a gate oxide layer over a trench bottom region;

forming a trench gate, which fills a void of the trench and overflows onto the gate oxide layer; and forming a source region in a top one of the drift region layers on one side of the trench gate, and a drain region in the top one of the drift region layers on the other side of the trench gate.

2. The method of claim 1, wherein the N-type dopant comprises phosphorus.

3. The method of claim 1, wherein the N-type dopant comprises gallium.

4. The method of claim 1, wherein the P-type dopant comprises boron.

5. The method of claim 1, wherein the P-type dopant comprises arsenic.

6. The method of claim 1, wherein the step of forming the source region and the drain region further comprises an annealing process.

7. The method of claim 1, wherein the step for forming the drift region layers further comprises performing an annealing process on the drift region layers, on which a temporary oxide layer is automatically formed, and removing the temporary oxide layer.

8. The method of claim 1, wherein the step of forming the trench comprises a photolithography process and an etching process.

9. The method of claim 8, wherein the etching process to form the trench comprises reactive ion etching (RIE).

10. The method of claim 1, wherein the step of forming the gate oxide layer comprises dry etching.

11. The method of claim 1, wherein the step of forming the trench gate comprises:

depositing polysilicon to fill the trench; and removing polysilicon outside the trench.

12. The method of claim 11, wherein the step of removing polysilicon outside the trench comprises a chemical mechanical polishing (CMP), which uses the gate oxide layer as a polishing stop.

13. The method of claim 11, wherein the step of removing polysilicon outside the trench comprises an etching back process, which uses the gate oxide layer as an etching stop.

14. The method of claim 1, wherein the step of forming the source region and the drain region comprises a photolithography process and an ion implantation process, and using the trench gate as a mask.

15. The method of claim 1, wherein a thickness of the gate oxide layer is about 500 Å–1000 Å.

16. The method of claim 1, wherein a thickness of the field oxide layer is about 4000 Å–12000 Å.

17. The method of claim 1, wherein the dopant density of the interchangeable source/drain regions is about $10^{15}$ ions/$cm^2$.

* * * * *